(12) United States Patent
Siemieniec et al.

(10) Patent No.: US 7,859,051 B2
(45) Date of Patent: Dec. 28, 2010

(54) SEMICONDUCTOR DEVICE WITH A REDUCED BAND GAP AND PROCESS

(75) Inventors: Ralf Siemieniec, Villach (AT);
Christian Foerster, Villach (AT);
Joachim Krumrey, Goedersdorf (AT);
Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 26 days.

(21) Appl. No.: 12/194,358

(22) Filed: Aug. 19, 2008

(65) Prior Publication Data

US 2010/0044720 A1    Feb. 25, 2010

(51) Int. Cl.
*H01L 29/66* (2006.01)
(52) U.S. Cl. .................. 257/334; 257/328; 257/329; 257/330; 257/331; 257/332
(58) Field of Classification Search .......... 257/328–334
See application file for complete search history.

(56) References Cited

U.S. PATENT DOCUMENTS

| | | | |
|---|---|---|---|
| 5,637,889 A * | 6/1997 | Groover et al. ............. 257/192 |
| 6,806,533 B2 | 10/2004 | Henninger et al. | |
| 6,833,584 B2 | 12/2004 | Henninger et al. | |
| 2005/0024925 A1 | 2/2005 | Deboy et al. | |
| 2006/0118863 A1 | 6/2006 | Dolny et al. | |
| 2006/0205194 A1* | 9/2006 | Bauer ......................... 438/542 |

FOREIGN PATENT DOCUMENTS

DE    19958234    6/2001

OTHER PUBLICATIONS

Calafut, D. "Trench power MOSFET lowside switch with optimized integrated Schottky diode", Proc. ISPSD 2004, pp. 397-400.
Fan, X. "SiGeC/Si superlattice microcoolers", Appl. Phys. Letters, vol. 78, Mar. 2001.

* cited by examiner

*Primary Examiner*—N Drew Richards
*Assistant Examiner*—Yu-Hsi Sun
(74) *Attorney, Agent, or Firm*—Dicke, Billig & Czaja, PLLC

(57) ABSTRACT

The application relates to a semiconductor device made of silicon with regionally reduced band gap and a process for the production of same. One embodiment provides a semiconductor device including a body zone, a drain zone and a source zone. A gate extends between the source zone and the drain zone. A reduced band gap region is provided in a region of the body zone, made of at least ternary compound semiconductor material.

13 Claims, 10 Drawing Sheets

US 7,859,051 B2

SEMICONDUCTOR DEVICE WITH A REDUCED BAND GAP AND PROCESS

BACKGROUND

The application relates to a semiconductor device made of silicon with regionally reduced band gap and a process for the production of same.

A semiconductor device made of silicon with a regionally reduced band gap is known from PCT/US2005/036036 which discloses a transistor with MOS-gate including a body region with a source region and a drain region which forms a pn-junction with the body region, the source having a lower energy gap than the body region. The lower energy gap in the source region is achieved due to the fact that, although the source zone remains highly n-doped, it consists of a binary compound semiconductor containing silicon and germanium and thus provides a band gap for the source zone which is smaller than the silicon band gap but larger than the germanium band gap. This weakens a parasitic bipolar transistor and thus improves the avalanche behaviour of the semiconductor device.

The production of a semiconductor device with a band gap in the source zone presents significant difficulties to be resolved in that following production of the source zone further high temperature processes are still required to produce a MOS gate transistor of this type. However, these high temperature processes create a risk that germanium will diffuse out of the silicon lattice in processes above 600° C., thereby rendering it impossible to maintain the desired reduced band gap in the source zone.

Other solutions for reducing the flow voltage drop of the body diode occurring at the pn-junction between the body zone and the drain zone which are known from the prior art are based on the parallel connection of an additional diode with a lower flow voltage parallel to the body diode. These parallel-connected diodes with lower flow voltage can either be connected externally in the form of germanium diodes or integrated in the semiconductor chip in the form of Schottky diodes. However, integrated Schottky diodes reduce the semiconductor area available for the MOSFET and the use of Schottky transitions results in a higher area-specific closing resistance.

In addition to the aforementioned germanium diodes of lesser band gap which can be connected externally in parallel to the body/drain pn-junction, it is also possible to integrate germanium diodes of this type with a typical flow voltage of 0.2 to 0.3 V on a silicon chip. However, germanium diodes integrated in this manner would have a relatively high leakage current when blocked, and due to the small band gap operating temperatures would have to be limited to below 90° C., temperatures unacceptable for power semiconductor devices. In addition, the leakage currents of pure germanium diodes increase exponentially at temperatures above 50° C.

Integrated diodes made of an SiGe binary compound semiconductor also present certain disadvantages relating to the thicknesses of the various layers needed for a silicon-germanium diode which necessarily require a buffer layer if SiGe is to be grown on a monocrystalline silicon crystal region, for example, in order to avoid crystal defects and to switch the lattice constants of the monocrystalline silicon to the lattice constants of the binary compound semiconductor SiGe. If this buffer layer is accommodated in the body region, for example, the flow voltage of the body diode increases. At the same time, the thickness of the useful SiGe layer is limited and too low for the layer thicknesses required for power semiconductor devices with an integrated SiGe diode made of a binary compound semiconductor material.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a schematic cross-section through a part of a semiconductor wafer made of monocrystalline silicon which is used as the substrate for the semiconductor device illustrated in FIG. 1.

FIG. 3 illustrates a schematic cross-section through the part of the semiconductor wafer illustrated in FIG. 2 with a fully grown silicon epitaxy layer.

FIG. 4 illustrates a schematic cross-section through the part illustrated in FIG. 3 after the introduction of a p-conducting body zone.

FIG. 5 illustrates a schematic cross-section through the part illustrated in FIG. 4 after the introduction of an n+-conducting source zone.

FIG. 6 illustrates a schematic cross-section through the part illustrated in FIG. 5 after the etching in of trench structures.

FIG. 7 illustrates a schematic cross-section through the part illustrated in FIG. 6 after the application of a gate oxide layer.

FIG. 8 illustrates a schematic cross-section through the part illustrated in FIG. 7 after the partial filling of the trench structure with an electrically conductive material.

FIG. 9 illustrates a schematic cross-section through a part illustrated in FIG. 8 after the application of an insulating intermediate layer and the introduction of a source contact window into the insulating intermediate layer.

FIG. 10 illustrates a schematic cross-section through a part illustrated in FIG. 9 after the etching of a source contact opening through the source zone to project into the body zone.

FIG. 11 illustrates a schematic cross-section through a part illustrated in FIG. 10 after the deposition of a ternary compound semiconductor in the base region of the source contact opening.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the present application relates to a semiconductor device made of silicon with regionally reduced band gap and a process for the production of same. The semiconductor device made of silicon has a body zone which forms a pn-junction with a drain zone. A source zone with the same type of conductivity as the drain zone is positioned in the region of the body zone. A gate extends between the source zone and the drain zone. A source electrode positioned in a source contact opening projects into the body zone. In this arrangement the source contact opening has in the region of the body zone beneath the source electrode a zone of at least ternary compound semiconductor material with a band gap smaller than the band gap of silicon.

With this semiconductor device, due to the regionally reduced band gap in the body zone the flow voltage of the body pn-junction is lower than is the case with a transistor made of monocrystalline silicon. Further, with a third component in the ternary compound semiconductor material it is possible to reduce crystal stresses due to the different lattice constants of silicon and a merely binary compound semiconductor material, thereby reducing crystal defects caused by lattice strain even with thicker deposition layers.

In a ternary compound semiconductor material based on the binary compound semiconductor material SiGe, lattice strains can be reduced by adding quadrivalent carbon to substitutional lattice sites in such a manner that it is possible to create an almost voltage-free transition from an area with the band gap of the silicon to a region with reduced band gap, thereby not only reducing the flow voltage, but also eliminating the need for buffer layers.

Figure 1:
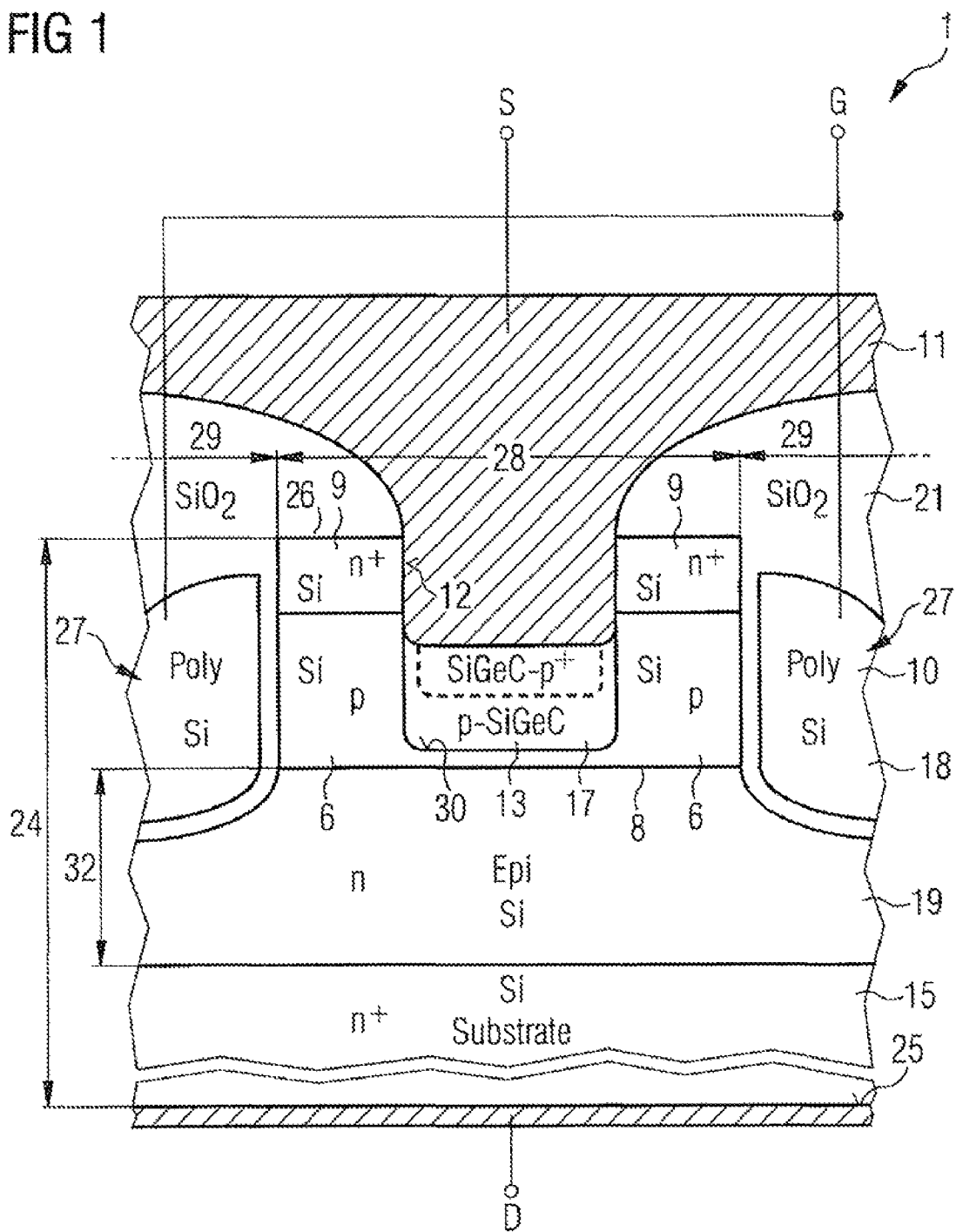
FIG. 1 illustrates a schematic partial cross-section of one embodiment of a semiconductor device.

FIG. 1 illustrates a schematic cross-section of one embodiment of a semiconductor device 1. The semiconductor device 1 is a MOS-transistor and consists of a semiconductor body 24 containing monocrystalline silicon which has a large-surface drain electrode D on its back 25. An n-conducting epitaxy layer 19 is applied to an nonconducting substrate 15 and the top 26 of the semiconductor body 24 is provided with a trench gate structure 27, mesa-structures 28 and trench structures 29 alternating with the trench gate structure 27.

In the mesa-structures 28 a p-conducting body zone 6 is integrated into the n-conducting silicon-epitaxy layer. In the vicinity of the top 26 of the semiconductor body 24 the body zone 6 turns into a $n^+$-conducting source zone. A source contact opening 12 is etched to project through the source zone 9 and into the body zone 6 in the mesa structure 28. A region with a smaller band gap than silicon is created in a base region 30 of this source contact opening 12 by positioning a ternary compound material made of SiGeC in the base region 30.

In this region of the ternary compound material 13 it is possible to increase the dopant concentration gradually or abruptly to concentrations of the order of $10^{18}$ $cm^3$ dopant atoms per cubic centimetre starting from the concentration of the body zone up to the transition to the electrically conducting source electrode 11. With this region which is made of a ternary compound semiconductor material 13 it is possible to reduce the flow voltage at the pn-junction 8 from the p-conducting body zone to the n-conducting drain zone.

Furthermore, with the additional carbon atoms on substitutional lattice sites it is possible to partially compensate for the lattice strains caused by the mismatch between silicon and germanium with carbon, such that this layer of ternary compound semiconductor material 13 has a reduced crystal defect density in the source contact opening. Thus it is possible to insert a layer thicker than the one illustrated here into this type of source contact opening. Moreover, in one embodiment the introduction of the ternary compound semiconductor 13 takes place after completion of the high temperature processes in the production of the semiconductor device 1 so that the germanium content is maintained rather than being reduced.

In one embodiment, the effect of a carbon concentration C in the ternary compound semiconductor material 13 can be achieved with a ratio to silicon and germanium of between $1:500 \leq C \leq 1:20$. Simulated calculations have illustrated that with a carbon concentration C in the ternary compound semiconductor material 13 with a ratio to silicon and germanium of between $1:200 \leq C \leq 1:100$, optimum reduction of lattice stresses is possible and that at the same time the forward voltages decisive for the operation of the semiconductor device 1 are reduced in relation to pure silicon.

In this arrangement the germanium concentration in the ternary compound semiconductor 13 is relatively high in relation to silicon and carbon, lying between $1:10 \leq Ge \leq 1:1$. An optimum germanium concentration in the ternary compound semiconductor material 13 in relation to silicon and carbon has proved to be between $1:5 \leq Ge \leq 1:4$. A clear reduction in voltage is achieved at this germanium concentration and both crystal defects and leakage currents have optimally low values.

The region with the ternary compound semiconductor material 13 in the body zone 6 is more highly doped than the body zone 6 itself. In one embodiment, the dopant gradient increases gradually from the body zone doping p within the ternary compound semiconductor materials 13 towards the source electrode 11 and reaches its highest value close to the aforementioned concentration of $10^{18}$ $cm^3$ dopant atoms per cubic centimetre immediately beneath the source electrode 11.

The ternary compound semiconductor material 13 is inserted into a source contact opening 12, as illustrated in FIG. 1, and as a result there are no further high temperature processes for the production of the silicon semiconductor device 1 after the introduction of the ternary compound semiconductor material 13. Nevertheless, it is possible due to the ternary content to ensure that the subsequent process temperatures can be set several hundreds of degrees higher than those for semiconductor devices with binary compound materials made of germanium and silicon before any serious out-diffusion of the germanium takes place. This temperature is approximately 800° C.

In summary, it can be said that the structure may provide the following:

1. There is no longer any need to limit the layer thickness of the ternary compound semiconductor material.

2. A buffer layer of silicon and germanium as required for binary compound semiconductor materials is no longer needed.

3. Higher temperatures of up to approximately 800° C. are possible for subsequent processes.

4. The special properties of the regionally smaller band gap of binary SiGe remain unchanged despite the substitutional integration of C.

A process for the production of a semiconductor device 1 with regionally reduced band gap is illustrated in FIGS. 2 to 11 below and includes the following process steps. First, as illustrated in FIG. 1, a semiconductor wafer 14 made of monocrystalline silicon is provided as the semiconductor substrate 15. In this embodiment, the semiconductor substrate is n$^+$-conducting and has a back 25 and a front 31.

Figure 2:
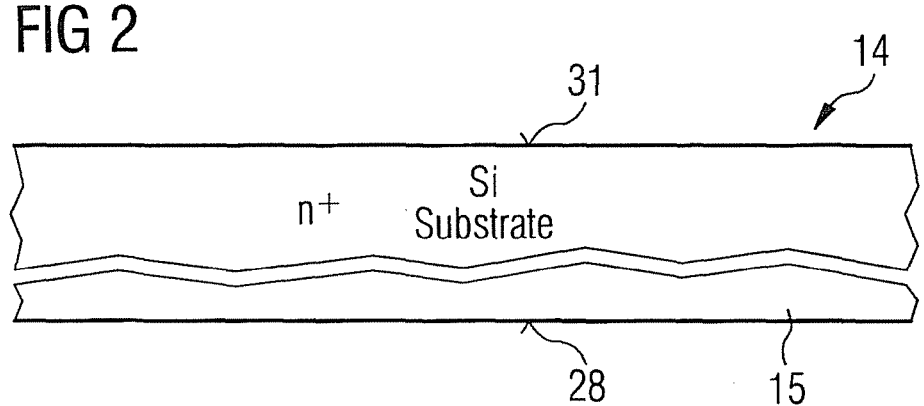
FIGS. 2 to 11 illustrate schematic cross-sections of part views of devices in the production of one embodiment of a semiconductor device made of silicon with regionally reduced band gap as illustrated in FIG. 1.
Figure 3:
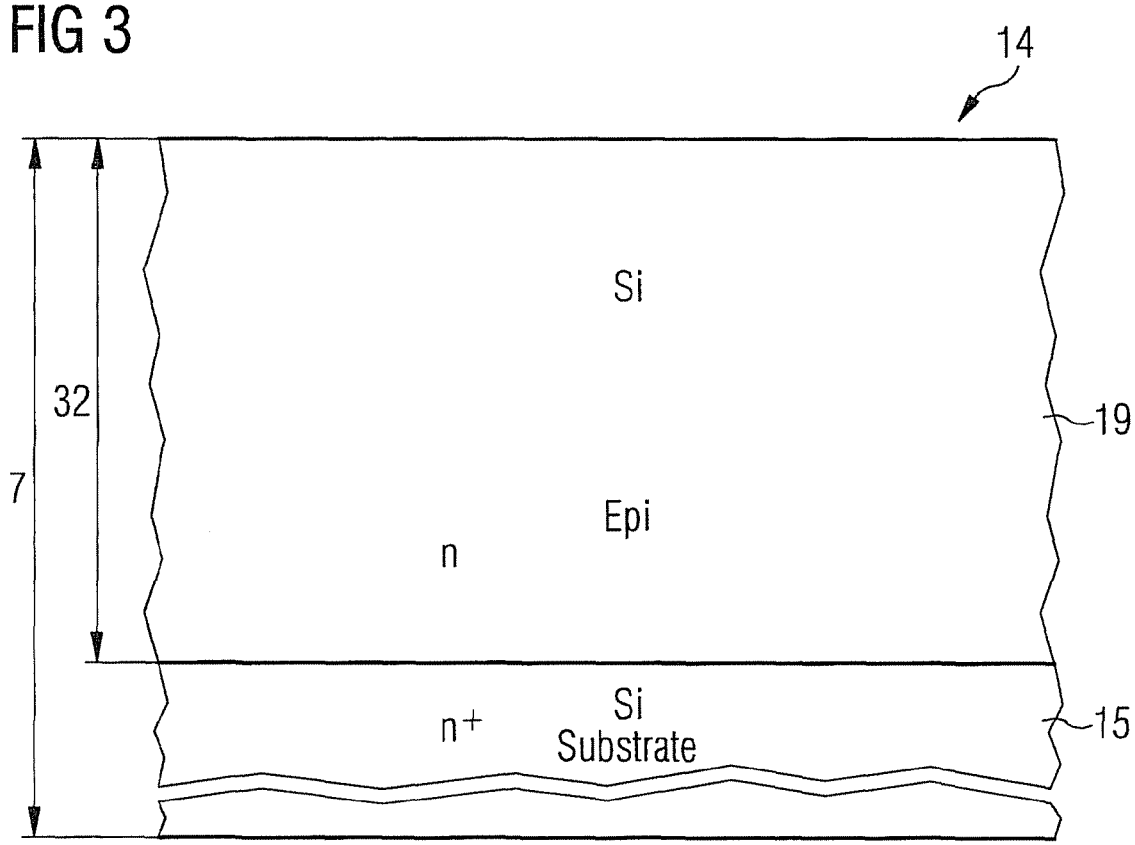

FIG. 3 illustrates a schematic cross-section through the part of the semiconductor body 24 illustrated in FIG. 2 with a fully grown silicon-epitaxy layer 19. This silicon-epitaxy layer 19 is n-conducting and largely forms a drift path 32 of a drain zone 7.

Figure 4:
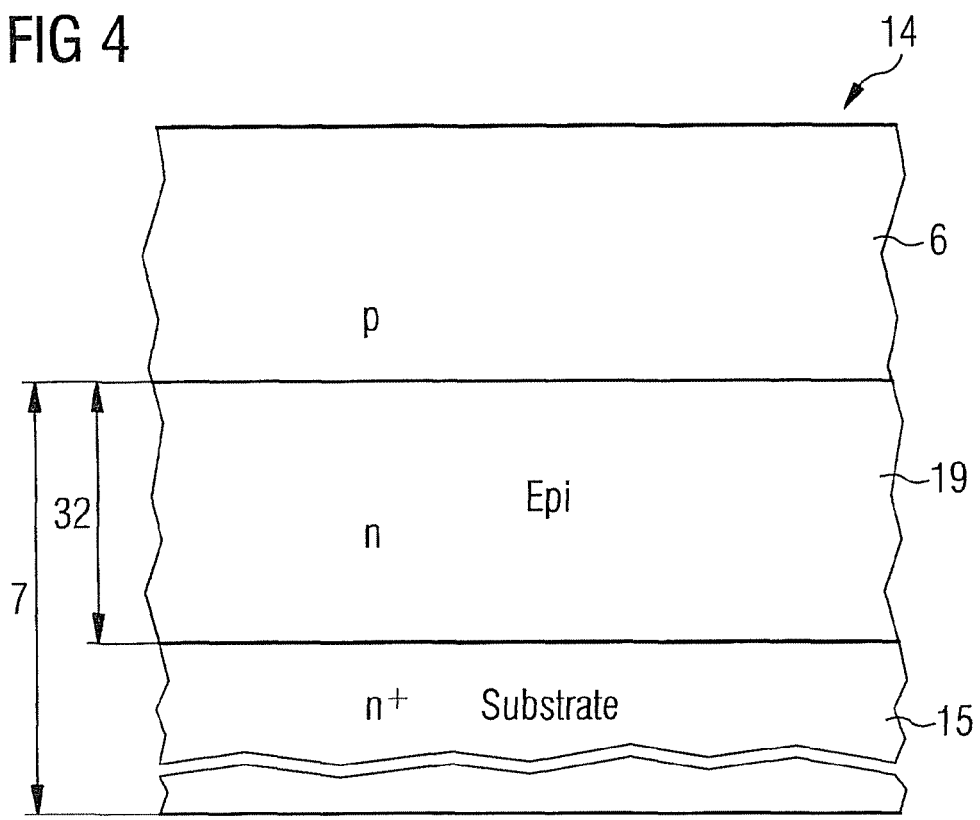

FIG. 4 illustrates a schematic cross-section through the part of the semiconductor wafer 14 illustrated in FIG. 3 after the introduction of a p-conducting body zone 6 with a complementary type of conductivity into the n-conducting epitaxy layer which represents a drift zone 32 of the drain zone 7.

Figure 5:
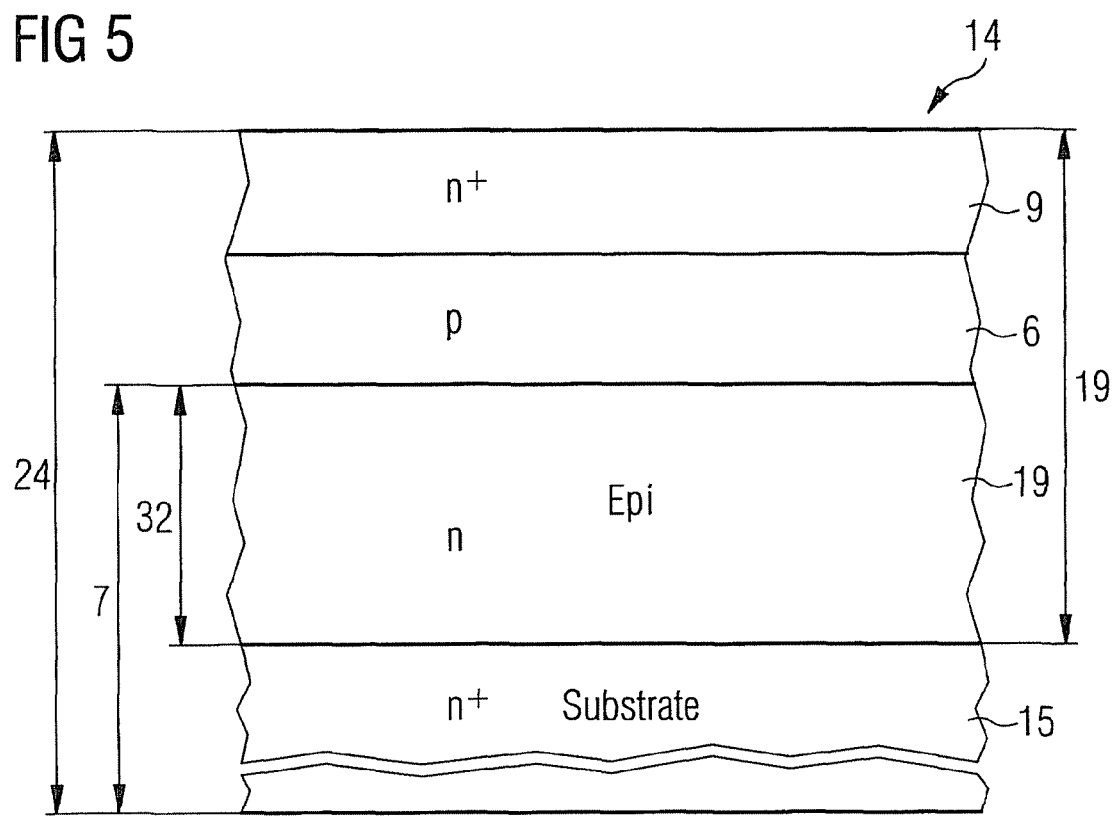

FIG. 5 illustrates a schematic cross-section through the part illustrated in FIG. 4 after the application of a n$^+$-conducting source zone 9 to the p-conducting body zone 6. These different zones can be applied to large surface areas of the semiconductor wafer 14 for the semiconductor body 24 as long as no charge compensation zones are provided for this MOS transistor in drift path 32.

Figure 6:
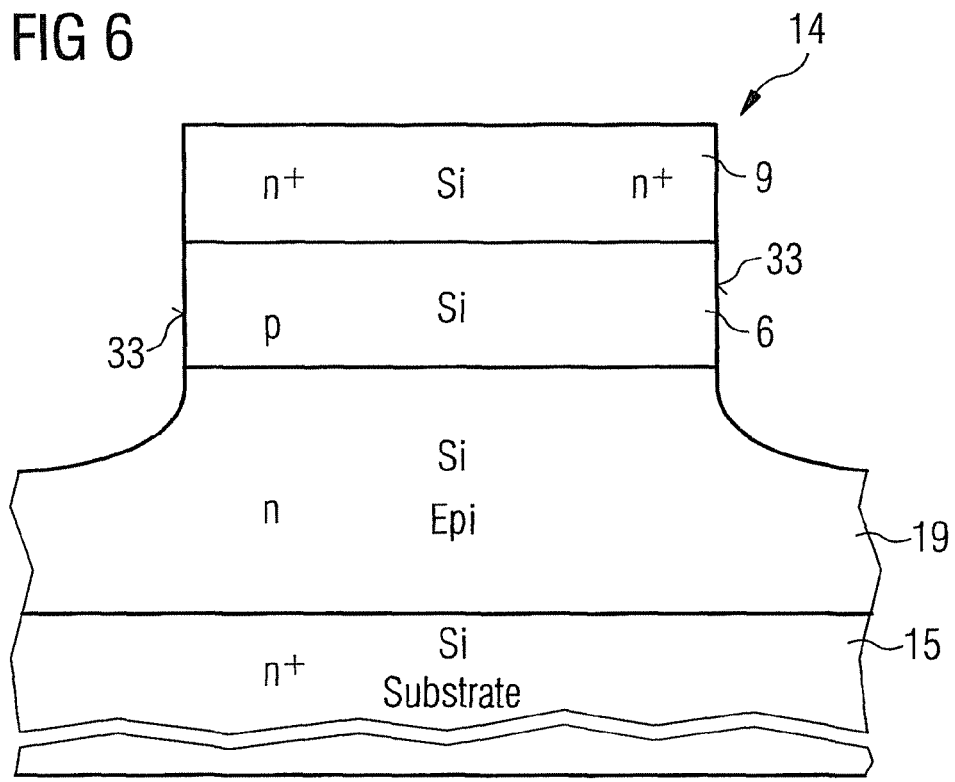
Figure 7:
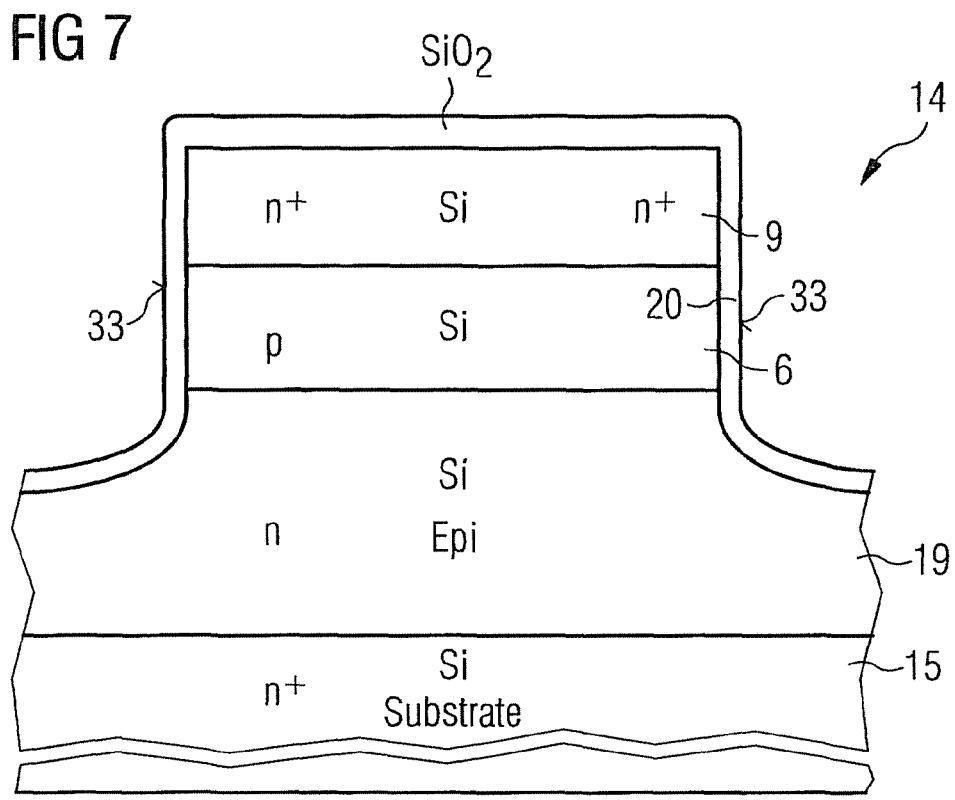

FIG. 6 illustrates a schematic cross-section through the part illustrated in FIG. 5 after the etching in of trench structures 33 for the trench gate structure to be applied subsequently. To this end, as illustrated in FIG. 7, a gate oxide layer 20 is applied to the structure illustrated in FIG. 6. This gate oxide layer 20 is applied by thermal oxidation using pure oxygen in order to create a silicon oxide layer which is as ion-free as possible in a thickness of between 90 and 300 nanometres. However, this oxide layer is required only in the region of the trench structure 33 and parts of it are removed during later etching processes and at the latest when the source contact windows are opened.

Figure 8:
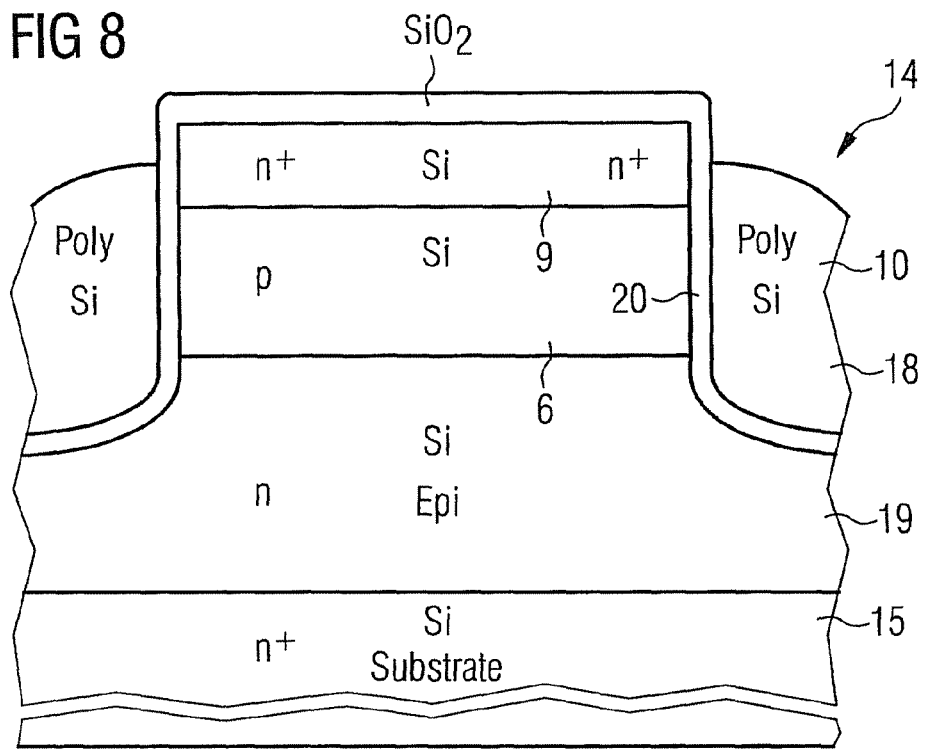

FIG. 8 illustrates a schematic cross-section through the part illustrated in FIG. 7 after the partial filling of the trench structure with an electrically conductive material 18 which is highly doped polysilicon and forms the gate electrodes 10 of the semiconductor device.

Figure 9:
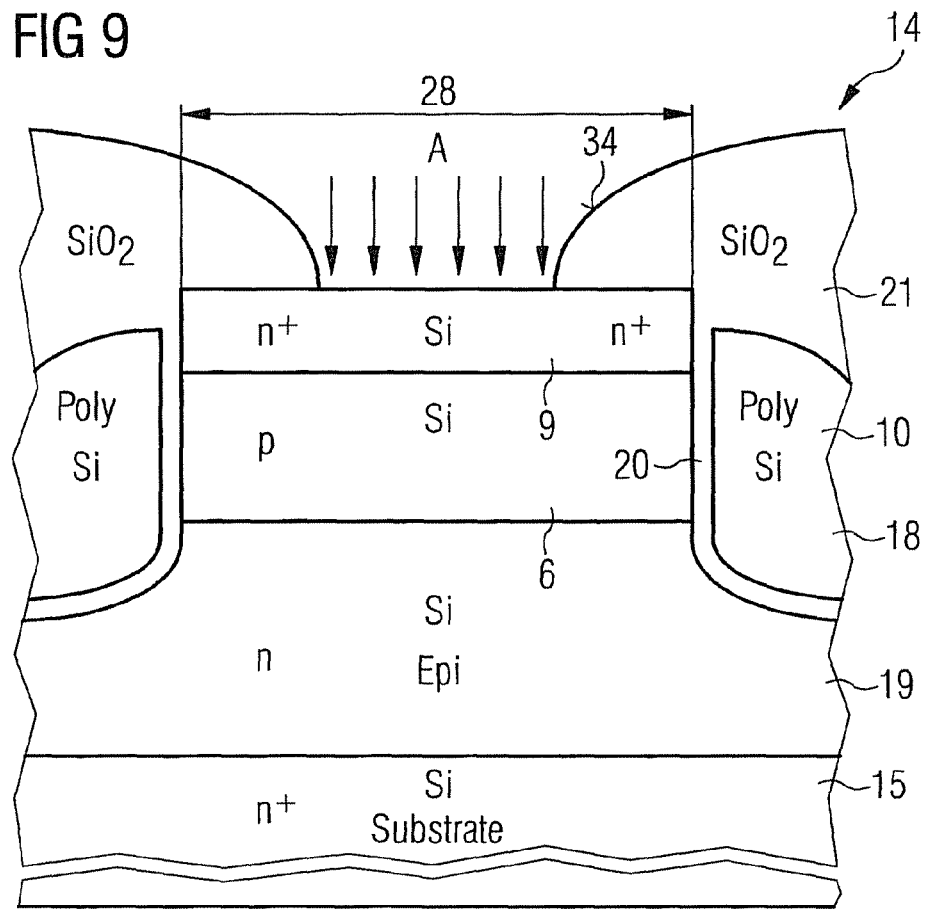

FIG. 9 illustrates a schematic cross-section through a part illustrated in FIG. 8 after the application of an insulating intermediate layer 21 and the introduction of a source contact window 34 into the insulating intermediate layer 21 which in this embodiment can be a silicon oxide. A source contact opening is then etched into the silicon material of the mesa structure 28 in the region of the source contact window 34 in the direction of arrow A, a dry etching technique with a corresponding reactive plasma being used to carry out an anisotropic etching process in the direction of arrow A.

Figure 10:
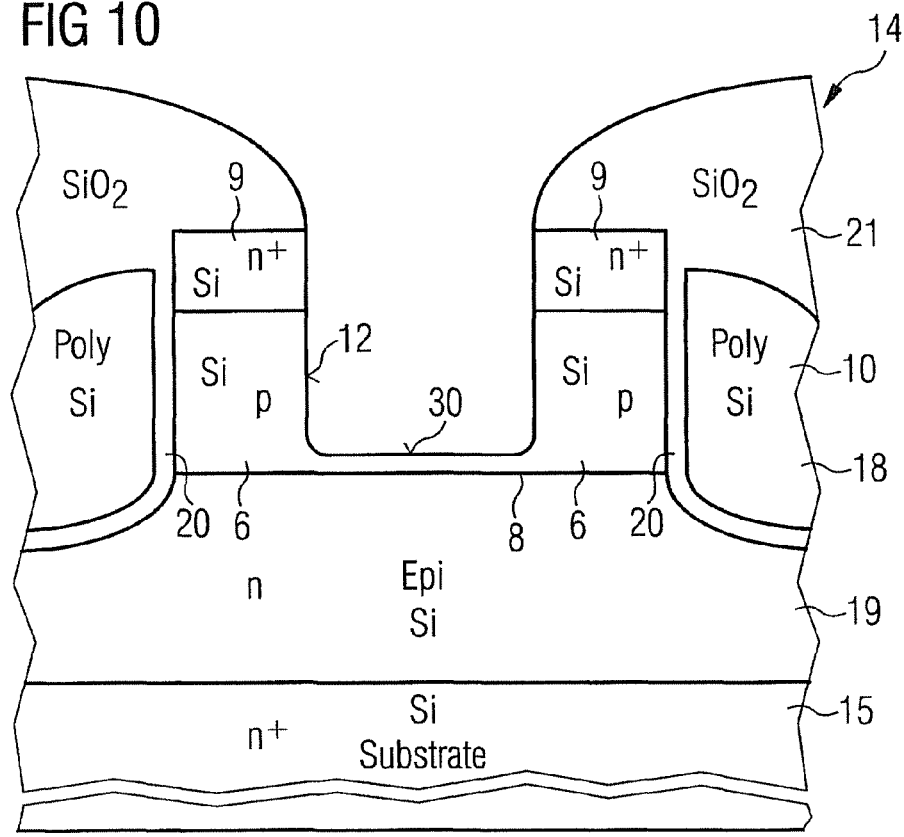

FIG. 10 illustrates a schematic cross-section through the part illustrated in FIG. 9 dafter the etching of a source contact opening through the source zone 9 and projecting into the body zone 6, the source contact opening 12 being pushed as close as possible to the pn-junction 8 to achieve a parallel connection to the body zone in order to reduce the flow voltage of the body zone pn-junction 8.

Figure 11:
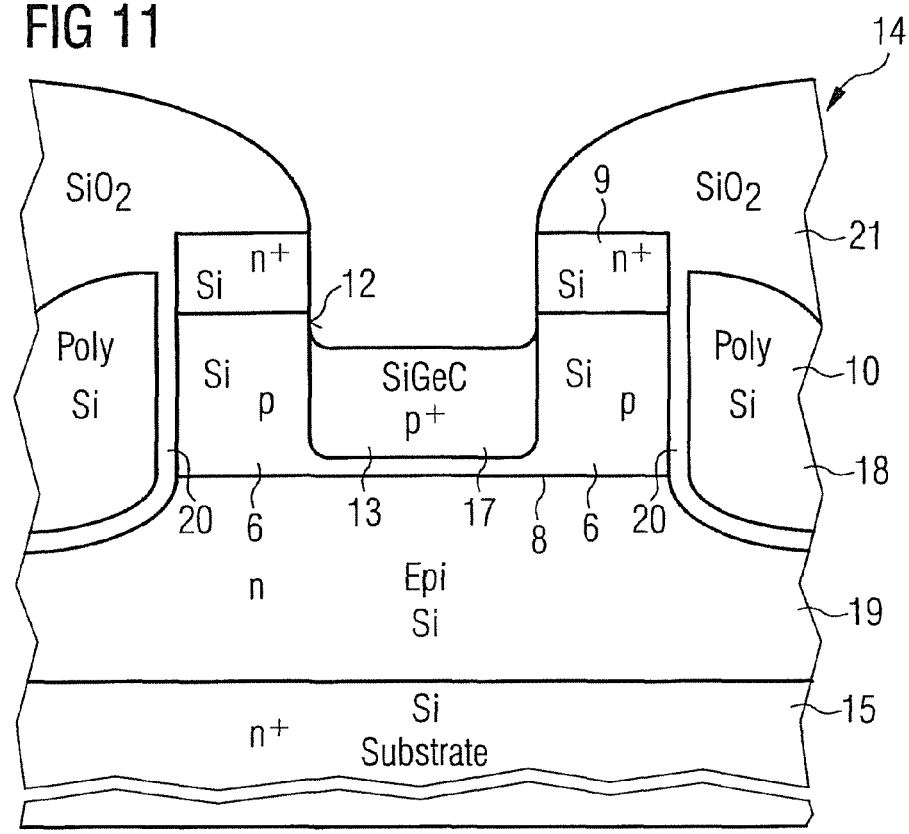

FIG. 11 illustrates a schematic cross-section through a part illustrated in FIG. 10 after deposition of a ternary compound semiconductor 13 in the base region 30 of the source contact opening 12. Thus, following completion of the high temperature processes, a sequence of layers 17 made of a ternary compound semiconductor material 13 is positioned in a lower region of the source contact opening 12. The source contact openings 12 can then be filled with electrically conducting material for a source electrode 11, as illustrated in FIG. 1.

This production process, in which the deposition of a ternary compound semiconductor 13 in the form of SiGeC is provided relatively far into the process for producing a semiconductor device structure and the ternary compound semiconductor material is inserted only in the region of the open contact hole trench, has the advantage that no further high temperature processes are required to act on the device since gate oxidation, where appropriate field oxidation, the application of an insulating intermediate layer 21 made of silicon dioxide, etc. have already taken place. The source contact opening 12 can be etched as deeply as possible in relation to the lower pn-junction 8 between the body zone 6 and the drain zone 7 using an etching technique, a dry etching technique, before the doped ternary compound semiconductor material 13 is deposited to fill the source contact hole.

Figure 12:
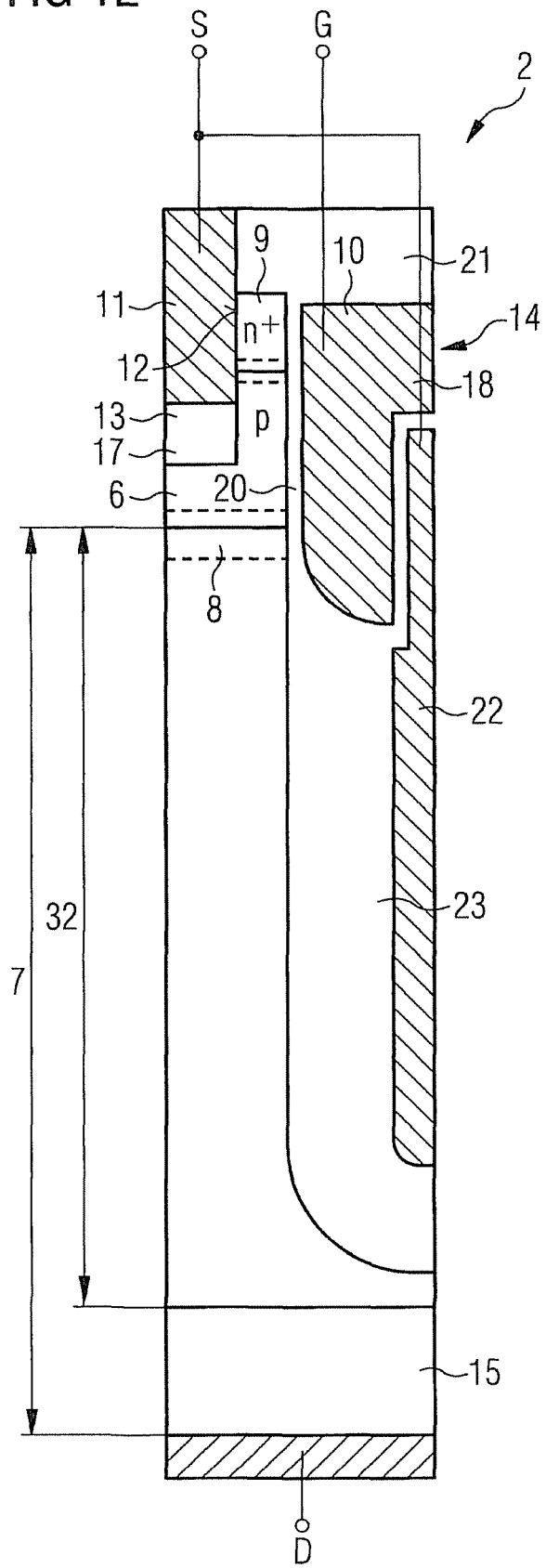
FIG. 12 illustrates a schematic partial cross-section of one embodiment of a semiconductor device.

In order to produce at least the structures illustrated in FIG. 12, the sequence of process steps described above is modified in that the trench structures are inserted before the body and source zones and additional process steps are required to insert both field plates with a field oxide and gate electrodes with a gate oxide into a trench structure as a trench gate structure. It is also to etch an appropriate trench structure into the semiconductor wafer even in the case of semiconductor devices which have only one trench gate structure.

Thus a process for the production of a semiconductor device with regionally reduced band gap includes the following process steps. First, a silicon semiconductor wafer is provided as the semiconductor substrate. A trench structure for receiving at least one MOS trench gate structure is inserted in the semiconductor wafer. Following introduction of the semiconductor structures into the silicon semiconductor wafer which has at least one body zone, one drain zone, one MOS trench gate and one source zone, source contact openings are produced which project through the source zone into the body zone and terminate shortly before a pn-junction to a drain zone positioned beneath it. Following completion of the high temperature processes, a sequence of layers made of a ternary compound semiconductor material are deposited in a lower region of the source contact openings, after which the source contact openings are filled with electrically conducting material for a source electrode.

If a field plate structure is also to be inserted into the trench structure, the process for producing a semiconductor device with regionally reduced band gap includes the following process. A silicon semiconductor wafer is provided as the semiconductor substrate. A trench structure for receiving at least one field plate structure and one MOS trench gate structure is inserted into the semiconductor wafer. Following the introduction of the semiconductor structures into the silicon semiconductor wafer which has at least one body zone, one drain zone, one field plate, one MOS trench gate and one source zone, source contact openings are produced which project through the source zone into the body zone and terminate shortly before a pn-junction positioned beneath it. Following completion of the high temperature processes, a sequence of layers made of a ternary compound semiconductor material are deposited in a lower region of the source contact opening and the source contact openings are then filled with electrically conducting material for a source electrode.

In one embodiment, the sequence of layers 17 made of the ternary compound semiconductor material 13 is produced in the lower region of the source contact opening 12 by using chemical or physical gas phase deposition. However, it is also possible to use an MBE Molecular Beam Epitaxy process or to attempt to fill the source contact openings 12 with the ternary compound semiconductor material 13 by ion implantation followed by recrystallisation. MBE processes for power semiconductor devices are, however, different in that the required thicknesses have cost, material and time implications. Given the high dosages of germanium and carbon required, ion implantation would lead to an amorphization of the silicon which it would not be possible to cure with the possible after-treatment temperatures of up to 800° C. As a result the dopant can not be sufficiently activated.

The dopant to be inserted during the deposition of the ternary compound semiconductor material 13 is inserted in a higher dopant concentration than the dopant concentration present in the body zone 6. Here it is possible to allow the dopant concentration to increase gradually from the dopant concentration of the body zone 6 up to the transition to the source electrode 11.

FIG. 12 illustrates a schematic cross-section through a part of a semiconductor device 2 as disclosed in a further embodiment. Components with functions identical to those in the preceding figures are designated using the same reference numerals and are not discussed in greater detail here. In this embodiment, too, a trench gate electrode 10 is integrated, the trench being deepened in such a manner that it is also possible to position in the trench a field plate 22 which is insulated from the drift path by a field oxide 23. However, the source potential to which the field plate 22 is set means that the field distribution in the drift path 32 can be influenced in such manner that the drift path can be more highly doped, and thus it is possible to achieve a more favourable closing resistance for the whole semiconductor device 2 with vertical field plates 22.

Independently of this field plate structure, however, a zone with a ternary compound semiconductor material 13 once again projects into the body zone 6, the ternary compound semiconductor material having a smaller band gap than the surrounding silicon, thereby reducing the flow voltage of the body diode in this semiconductor device 2.

Figure 13:
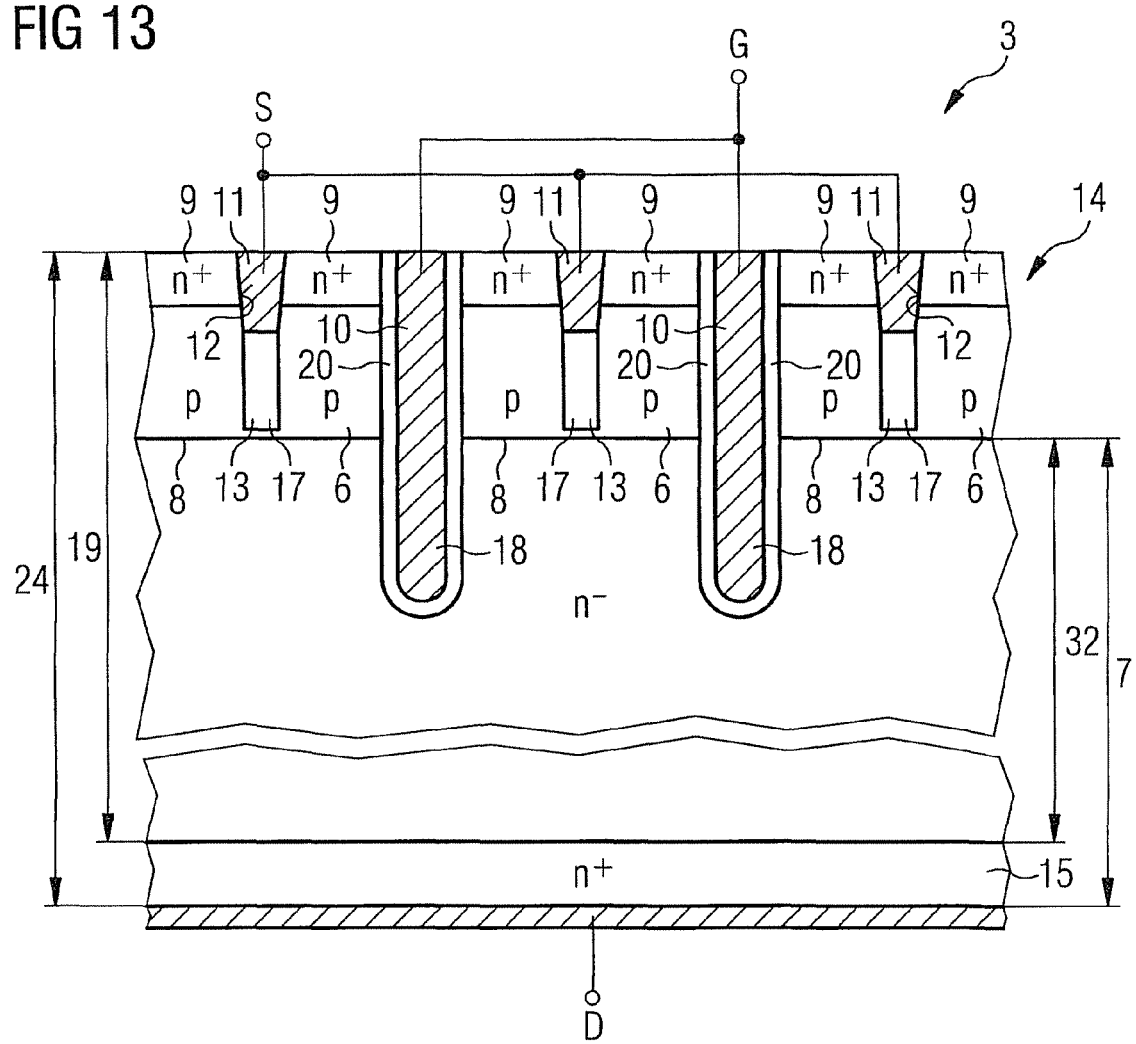
FIG. 13 illustrates a schematic partial cross-section of one embodiment of a semiconductor device.

FIG. 13 illustrates a schematic cross-section through a part of a semiconductor devices 3 as disclosed in a further embodiment, this part having several transistor cells of a MOS transistor with a trench gate structure. A region with a ternary compound semiconductor material 13 is positioned in the body zone 6 of each of the cells in order to reduce the flow voltage of the body zone pn-junction.

Figure 14:
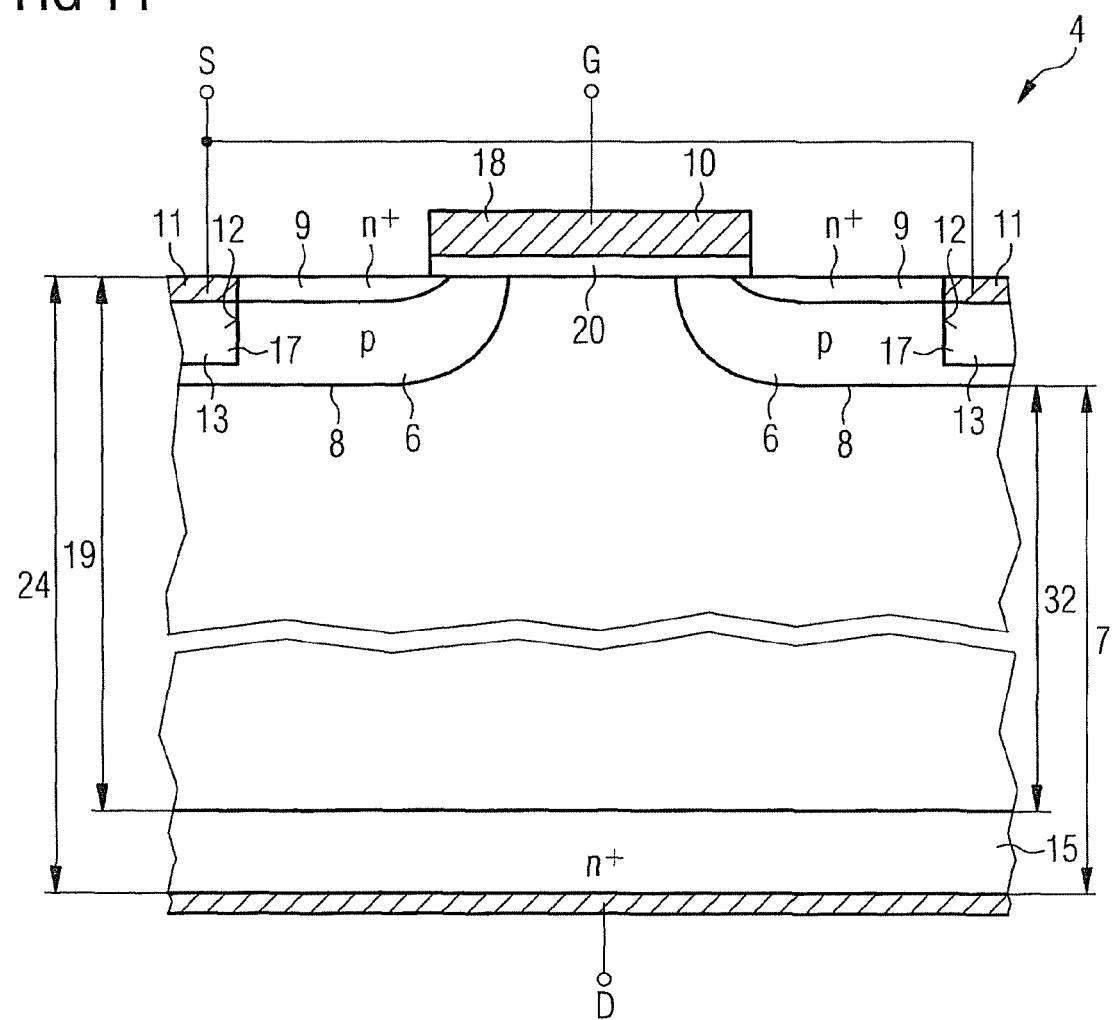
FIG. 14 illustrates a schematic partial cross-section of one embodiment of a semiconductor device of a further embodiment.

FIG. 14 illustrates a schematic cross-section through a part of a semiconductor device 4 as disclosed in a further embodiment. This embodiment differs from the previous version in that a lateral gate structure is provided, a region with a reduced band gap consisting of a sequence of layers 17 of a ternary compound semiconductor materials 13 once again projecting into the body zone 6 and being positioned beneath the source electrodes 11.

Figure 15:
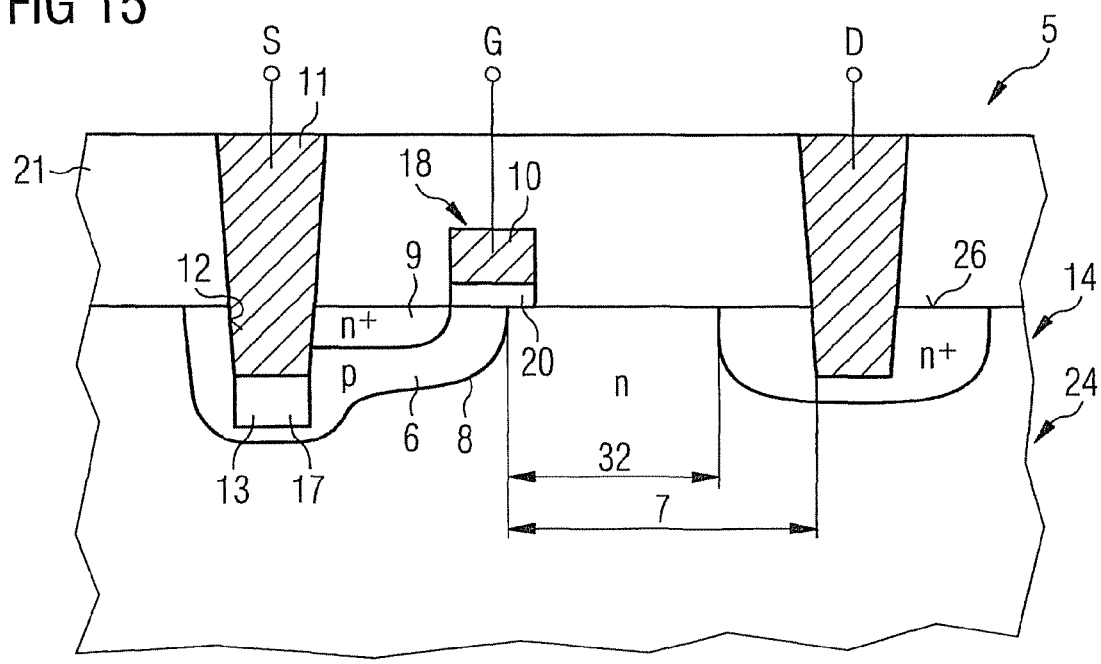
FIG. 15 illustrates a schematic partial cross-section of one embodiment of a semiconductor device.

FIG. 15 illustrates a schematic cross-section through a part of a semiconductor device 5 as disclosed in a further embodiment. This embodiment differs from the preceding versions in that the previous versions illustrate vertical MOS transistors while here there is a lateral MOS transistor, a sequence of layers 17 of a ternary compound semiconductor material which has a lower band gap than the surrounding silicon once again projecting into the body zone 6. In a lateral MOS transistor source S, gate G and drain D are positioned on the top 26 of the semiconductor body 24 and the drift path 32 extends laterally between the body zone 6 and the drain electrode D.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a body zone, a drain zone and a source zone;
a gate which extends between the source zone and the drain zone; and
a reduced band gap region in a region of the body zone, comprising of at least ternary compound semiconductor material;
wherein a lateral extent of the zone of ternary compound semiconductor material corresponds to the lateral extent of a source contact opening.

2. The semiconductor device of claim 1, wherein the ternary compound semiconductor material comprises silicon, germanium and carbon.

3. The semiconductor device of claim 1, wherein the ternary compound semiconductor material is more highly doped than the body zone.

4. The semiconductor device of claim 1, wherein a metal of the source contact is directly in contact with the ternary compound semiconductor material.

5. A semiconductor device made of silicon comprising:
a body zone;
a drain zone which forms a pn-junction with the body zone;
a source zone with the same type of conductivity as the drain zone, the source zone being positioned in the region of the body zone;
a gate which extends between the source zone and the drain zone;
a source electrode which is positioned in a source contact opening and projects into the body zone; and
the source contact opening in the region of the body zone beneath the source electrode having a zone of at least ternary compound semiconductor material with a band gap which is smaller than the band gap of silicon;
wherein a lateral extent of the zone of ternary compound semiconductor material corresponds to the lateral extent of the source contact opening.

6. The semiconductor device of claim 5, wherein the ternary compound semiconductor material comprises silicon, germanium and carbon.

7. The semiconductor device of claim 6, wherein the carbon concentration C in the ternary compound semiconductor material is between $1:500 \leqq C \leqq 1:20$ in relation to the sum of the silicon and germanium.

8. The semiconductor device of claim 6, wherein the carbon concentration C in the ternary compound semiconductor material is between $1:200 \leqq C \leqq 1:100$ in relation to the sum of the silicon and germanium.

9. The semiconductor device of claim 6, wherein the germanium concentration in the ternary compound semiconductor material is between 1:10≦Ge≦1:1 in relation to the sum of the silicon and carbon.

10. The semiconductor device of claim 6, wherein the germanium concentration in the ternary compound semiconductor material is between 1:5≦Ge≦1:4 in relation to the sum of the silicon and carbon.

11. The semiconductor device of claim 5, wherein the ternary compound semiconductor material is more highly doped than the body zone.

12. A semiconductor device comprising:
a body zone, a drain zone and a source zone;
a gate which extends between the source zone and the drain zone; and
a reduced band gap region in a region of the body zone, comprising of at least ternary compound semiconductor material,
wherein the doping level of the zone comprising the ternary compound semiconductor material is varied such that the doping level is higher directly adjacent a metal of a source contact.

13. A semiconductor device made of silicon comprising:
a body zone;
a drain zone which forms a pn-junction with the body zone;
a source zone with the same type of conductivity as the drain zone, the source zone being positioned in the region of the body zone;
a gate which extends between the source zone and the drain zone;
a source electrode which is positioned in a source contact opening and projects into the body zone; and
the source contact opening in the region of the body zone beneath the source electrode having a zone of at least ternary compound semiconductor material with a band gap which is smaller than the band gap of silicon;
wherein the doping level of the zone comprising the ternary compound semiconductor material is varied such that the doping level is higher directly adjacent a metal of the source electrode.

* * * * *